(12) United States Patent
Tokuhira et al.

(10) Patent No.: US 10,672,793 B2
(45) Date of Patent: Jun. 2, 2020

(54) SEMICONDUCTOR MEMORY DEVICE

(71) Applicant: Toshiba Memory Corporation, Minato-ku, Tokyo (JP)

(72) Inventors: Hiroki Tokuhira, Kawasaki Kanagawa (JP); Kazuhiko Yamamoto, Fujisawa Kanagawa (JP); Kunifumi Suzuki, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/267,878

(22) Filed: Feb. 5, 2019

(65) Prior Publication Data

US 2020/0091171 A1 Mar. 19, 2020

(30) Foreign Application Priority Data

Sep. 15, 2018 (JP) .................. 2018-173139

(51) Int. Cl.
*H01L 29/792* (2006.01)
*H01L 27/11582* (2017.01)
*H01L 29/51* (2006.01)

(52) U.S. Cl.
CPC ...... *H01L 27/11582* (2013.01); *H01L 29/513* (2013.01); *H01L 29/517* (2013.01)

(58) Field of Classification Search
CPC . H01L 27/11582; H01L 29/513; H01L 29/517
USPC ........................................... 257/324
See application file for complete search history.

(56) References Cited

U.S. PATENT DOCUMENTS

| | | | |
|---|---|---|---|
| 9,142,774 B2 | 9/2015 | Yabuhara et al. | |
| 9,159,769 B2 | 10/2015 | Suguro | |
| 2008/0251836 A1 | 10/2008 | Park | |
| 2009/0242970 A1 | 10/2009 | Shimizu et al. | |
| 2012/0292587 A1 | 11/2012 | Matsuo et al. | |
| 2018/0151672 A1* | 5/2018 | Choi | H01L 27/11524 |
| 2018/0240811 A1* | 8/2018 | Kim | H01L 27/11565 |
| 2019/0115364 A1* | 4/2019 | Jeon | G11C 16/26 |
| 2019/0288001 A1* | 9/2019 | Yu | H01L 27/11568 |

FOREIGN PATENT DOCUMENTS

JP 2009-218260 A 9/2009

* cited by examiner

*Primary Examiner* — David S Blum
(74) *Attorney, Agent, or Firm* — Foley & Lardner LLP

(57) ABSTRACT

A semiconductor memory device includes a stacked body including insulating layers and gate electrode layers alternately stacked in a direction, a semiconductor layer extending in the direction, and a gate insulating layer provided between the semiconductor layer and the gate electrode layer, and including a first layer, a second layer, and a third layer between the first layer and the second layer. The first layer includes a first insulator, the second layer includes at least one oxide selected from aluminum oxide, yttrium oxide, lanthanum oxide, gadolinium oxide, ytterbium oxide, hafnium oxide, and zirconium oxide, the third layer includes at least one material selected from silicon, germanium, silicon germanium and silicon carbide, and the third layer is positioned between the semiconductor layer and the insulating layer.

20 Claims, 8 Drawing Sheets

Vth High

Vth Low

SEMICONDUCTOR MEMORY DEVICE

CROSS-REFERENCE TO RELATED APPLICATIONS

This application claims the benefit of and priority to Japanese Patent Application No. 2018-173139, filed Sep. 15, 2018, the entire contents of which are incorporated herein by reference.

FIELD

Embodiments described herein relate generally to a semiconductor memory device.

BACKGROUND

In order to increase a capacity of a flash memory, a three-dimensional NAND flash memory where a plurality of memory cells are three-dimensionally arranged may be provided. In order to further increase the capacity of the three-dimensional NAND flash memory, it may be desirable to reduce a size of the memory cell. For example, it is possible to reduce the size of the memory cell by using a thin gate insulating layer of the memory cell provided between a semiconductor layer and a gate electrode.

In a memory cell of a metal oxide nitride oxide semiconductor (MONOS) type, for example, a stacked structure of an oxide tunnel insulating film, a nitride charge storage film, and an oxide block insulating film may be used in a gate insulating layer. From a viewpoint of accumulating a desired charge, the charge storage may be designed to have a film thickness equal to or greater than a certain value. In addition, from a viewpoint of preventing an escape of the charge from the charge storage film, the tunnel insulating film and the block insulating film may be designed to have a film thickness equal to or greater than a certain value. Therefore, in the memory cell of the MONOS type, it can be challenging to implement a thin gate insulating layer.

DETAILED DESCRIPTION

Figure 1:
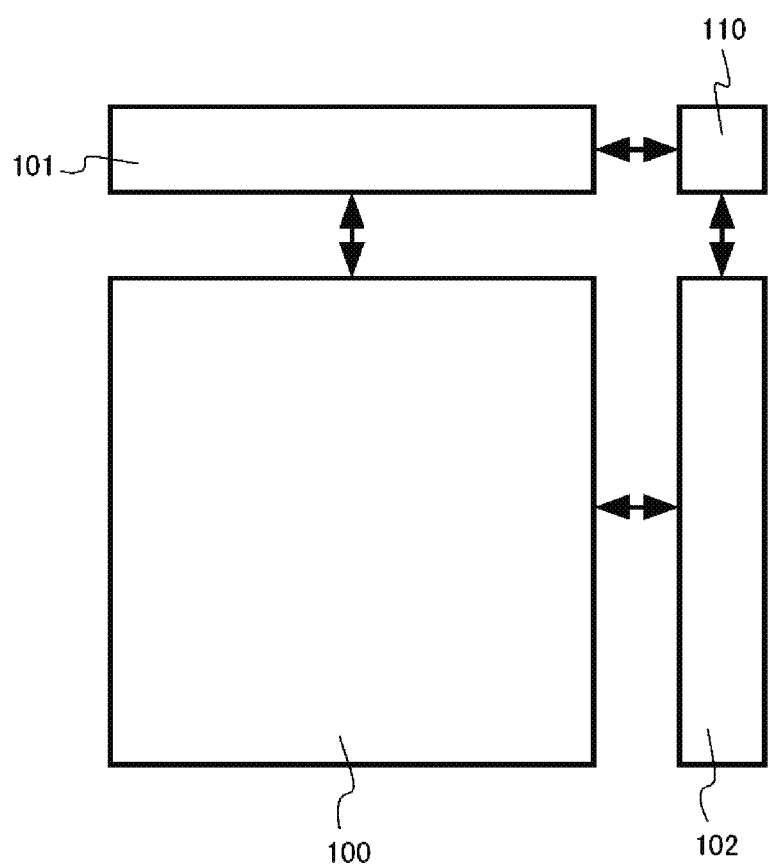
FIG. 1 is a block diagram of a semiconductor memory device according to a first embodiment of the present disclosure.

Certain embodiments described herein provide for a semiconductor memory device that implements a thin gate insulating layer of a memory cell.

In general, according to one embodiment, A semiconductor memory device includes a stacked body including insulating layers and gate electrode layers alternately stacked in a direction, a semiconductor layer extending in the direction, and a gate insulating layer provided between the semiconductor layer and the gate electrode layer, and including a first layer, a second layer, and a third layer between the first layer and the second layer. The first layer includes a first insulator, the second layer includes at least one oxide selected from aluminum oxide, yttrium oxide, lanthanum oxide, gadolinium oxide, ytterbium oxide, hafnium oxide, and zirconium oxide, the third layer includes at least one material selected from silicon, germanium, silicon germanium and silicon carbide, and the third layer is positioned between the semiconductor layer and the insulating layer.

In the present specification, the same or similar members or components may be denoted by same reference numerals, and redundant description may be omitted in some cases.

It is possible to perform qualitative analysis and quantitative analysis of a chemical composition of members configuring a semiconductor memory device described herein using secondary ion mass spectroscopy (SIMS), and/or energy dispersive X-ray spectroscopy (EDX). In addition, for measurement of a thickness of the member configuring the semiconductor memory device, a distance between the members, and the like, for example, a transmission electron microscope (TEM) may be used. In addition, for identification of a crystal structure of the members configuring the semiconductor memory device, for example, in addition to the above-described TEM, a convergent-beam electron diffraction (CBED), an X-ray diffraction method using a free electron laser such as synchrotron radiation or spring-8 angstrom compact free electron laser (SACLA), a Fourier transform infrared spectroscopy (FT-IR) or X-ray photoelectron spectroscopy (XPS) can be used.

Hereinafter, certain embodiments of the present disclosure will be described with reference to the drawings.

First Embodiment

An example semiconductor memory device according to the first embodiment includes a stacked body including insulating layers and gate electrode layers alternately stacked in a direction, a semiconductor layer extending in the direction, and a gate insulating layer provided between the semiconductor layer and the gate electrode layer, and including a first layer, a second layer, and a third layer between the first layer and the second layer. The first layer includes a first insulator, the second layer includes at least one oxide selected from aluminum oxide, yttrium oxide, lanthanum oxide, gadolinium oxide, ytterbium oxide, hafnium oxide, and zirconium oxide, the third layer includes at least one material selected from silicon, germanium, silicon germanium and silicon carbide, and the third layer is positioned between the semiconductor layer and the insulating layer.

In addition, a semiconductor memory device may include a plurality of gate electrode layers stacked in a direction and spaced apart from each other, a semiconductor layer extending in the direction, and a gate insulating layer provided between the semiconductor layer and the plurality of gate electrode layers, and including a first layer, a second layer, and a third layer between the first layer and the second layer. The first layer includes a first insulator, the second layer includes at least one oxide selected from aluminum oxide, yttrium oxide, lanthanum oxide, gadolinium oxide, ytterbium oxide, hafnium oxide, and zirconium oxide, the third layer includes at least one material selected from silicon, germanium, silicon germanium, and silicon carbide, and the third layer is positioned between the plurality of gate electrode layers and the semiconductor layer.

The semiconductor memory device according to the first embodiment may include a three-dimensional NAND flash memory where a plurality of memory cells are three-dimensionally arranged.

Figure 2:
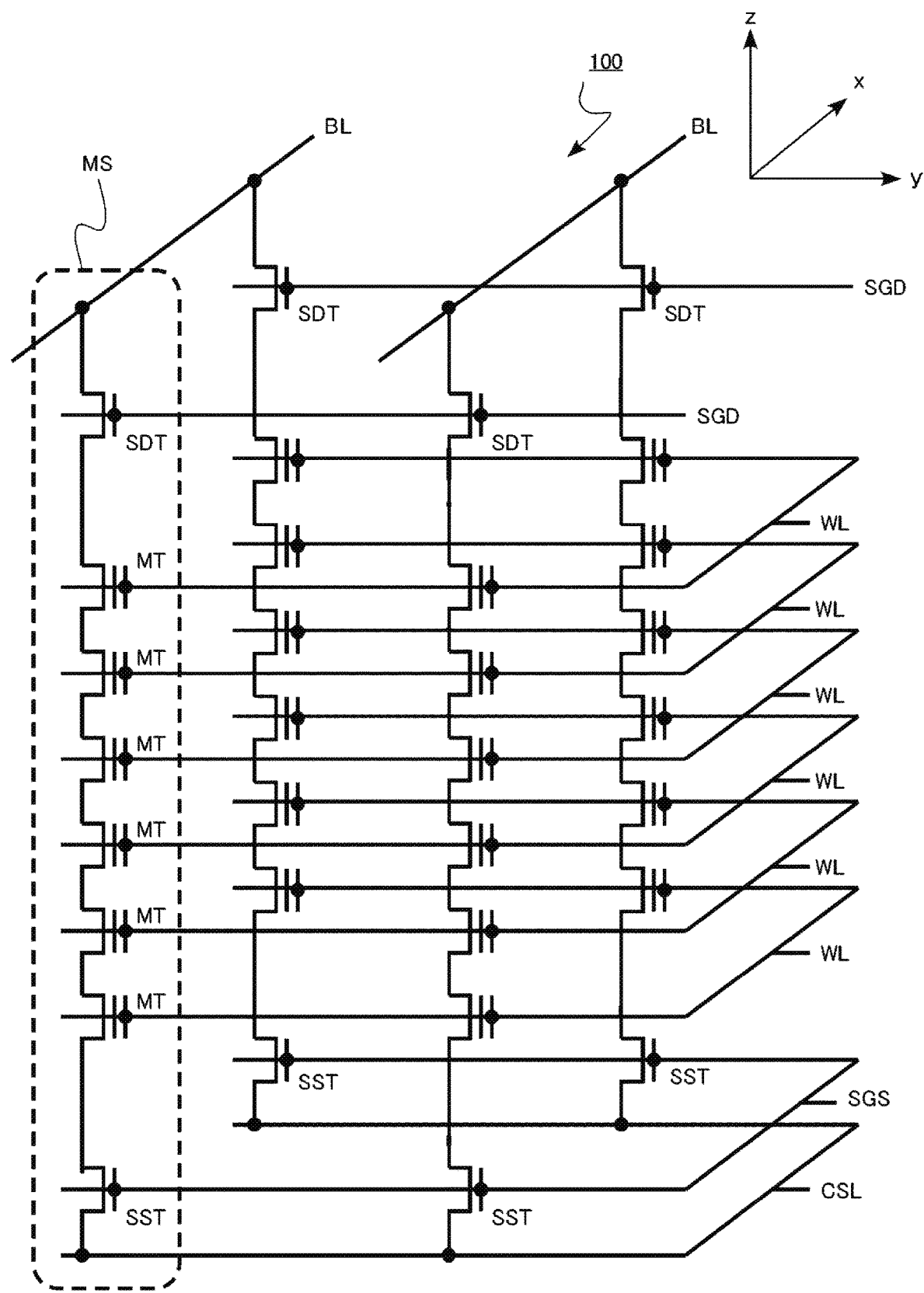
FIG. 2 is a circuit diagram of a memory cell array of the semiconductor memory device according to the first embodiment.
Figure 3:
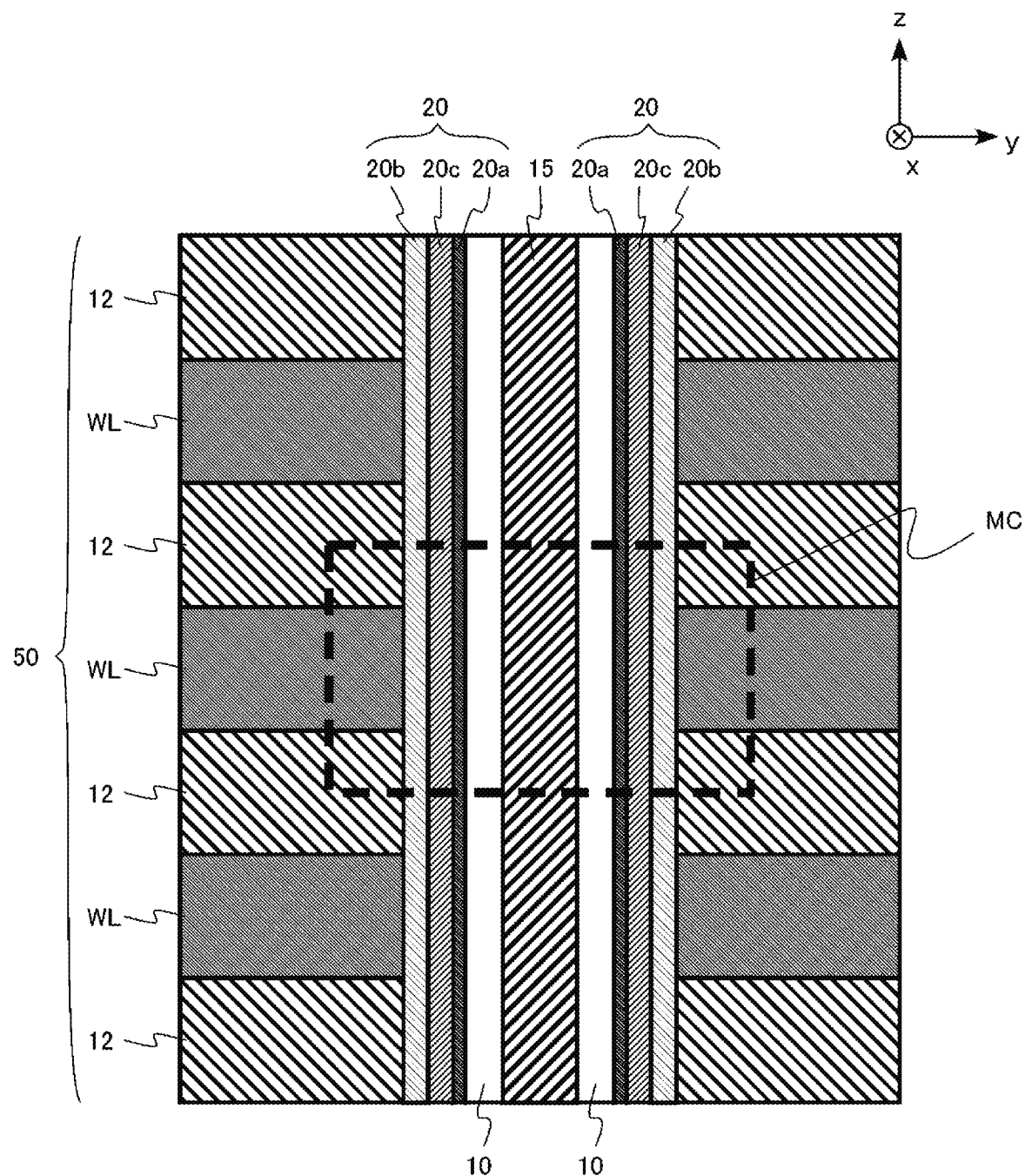
FIG. 3 is a schematic cross-sectional view of a memory string of the semiconductor memory device according to the first embodiment.

FIG. 1 is a block diagram of the semiconductor memory device according to the first embodiment. FIG. 2 is a circuit diagram of a memory cell array of the semiconductor memory device according to the first embodiment. FIG. 3 is a schematic cross-sectional view of a memory string of the semiconductor memory device according to the first embodiment. FIG. 3 illustrates a cross section of a plurality of memory cell transistors MT in one memory string MS surrounded by a dotted line in the memory cell array 100 of FIG. 2. In FIG. 3, a region surrounded by the dotted line corresponds to one memory cell MC and includes one memory cell transistor MT.

As shown in FIG. 1, the three-dimensional NAND flash memory includes a memory cell array 100, a first peripheral circuit 101, a second peripheral circuit 102, and a control circuit 110.

As illustrated in FIG. 2, the memory cell array 100 of the three-dimensional NAND flash memory according to the first embodiment includes a plurality of word lines WL, a common source line CSL (an example of a first conductive layer), a source select gate line SGS, a plurality of drain select gate lines SGD, a plurality of bit lines BL (an example of second conductive layers), and a plurality of memory strings MS.

In FIG. 2, an x-direction, a y-direction, and a z-direction are directions orthogonal to each other. The three-dimensional NAND flash memory according to the first embodiment has a so-called BiCS structure.

As illustrated in FIG. 2, the memory string MS includes a source select transistor SST, a plurality of memory cell transistors MT, and a drain select transistor SDT connected in series between the common source line CSL (an example of a first conductive layer) and the bit line BL (an example of a second conductive layer). One memory string MS is selected by the bit line BL and the drain select gate line SGD, and one memory cell transistor MT is selected by the word line WL.

As illustrated in FIG. 3, the memory cell array 100 includes a plurality of word lines WL (an example of gate electrode layers), a semiconductor layer 10, a plurality of interlayer insulating layers 12 (an example of insulating layers, or insulating portions), a core insulating layer 15, and a gate insulating layer 20. The plurality of word lines WL and the plurality of interlayer insulating layers 12 form a stacked body 50. The gate insulating layer 20 includes an interface insulating layer 20a (an example of a first layer), a charge storage layer 20b (an example of a second layer), and an oxygen absorbing layer 20c (an example of a third layer).

The word lines WL and the interlayer insulating layers 12 may be provided on a semiconductor substrate that is not illustrated.

The word lines WL and the interlayer insulating layers are alternately stacked in the z direction on the semiconductor substrate. The world lines WL may be spaced form each other. The interlayer insulating layers 12 may be spaced from each other. The plurality of word lines WL and the plurality of interlayer insulating layers 12 form the stacked body 50.

The word lines WL include, for example, a plate-shaped conductor. The word lines WL include, for example, a metal or a semiconductor. The word lines WL include, for example, tungsten (W). The word lines WL function as a gate electrode of the memory cell transistor MT. The word lines WL are an example of a gate electrode layer.

The word lines WL are separated from each other by the interlayer insulating layers 12. The interlayer insulating layers 12 include, for example, silicon oxide.

The core insulating layer 15 is provided in the stacked body 50. The core insulating layer 15 extends in the z direction. The core insulating layer 15 is provided such that it penetrates the stacked body 50. The core insulating layer 15 is surrounded by the semiconductor layer 10. The core insulating layer 15 includes, for example, silicon oxide.

The semiconductor layer 10 is provided in the stacked body 50. The semiconductor layer 10 extends in the z direction. The semiconductor layer 10 is provided such that it penetrates the stacked body 50. The semiconductor layer 10 is provided around the core insulating layer 15 (e.g. surrounds the core insulating layer). The semiconductor layer 10 has, for example, a cylindrical shape.

The semiconductor layer 10 includes, for example, polycrystalline silicon or polycrystalline silicon germanium. The semiconductor layer 10 includes, for example, a p-type impurity or an n-type impurity. The semiconductor layer 10 functions as a channel of the memory cell transistor MT.

The gate insulating layer 20 is provided between the semiconductor layer 10 and the word lines WL. The gate insulating layer 20 includes the interface insulating layer 20a, the charge storage layer 20b, and the oxygen absorbing layer 20c. The interface insulating layer 20a, the oxygen absorbing layer 20c, and the charge storage layer 20b are provided in that order from the semiconductor layer 10 toward the word lines WL.

The interface insulating layer 20a is also provided between the semiconductor layer 10 and the interlayer insulating layers 12. The interface insulating layer 20a is a layer continuous in the z direction.

The interface insulating layer 20a includes a first insulator. The first insulator includes, for example, oxide, nitride, or oxynitride. The first insulator includes, for example, silicon oxide or aluminum oxide.

The interface insulating layer 20a has a function of electrically insulating the semiconductor layer 10, the oxygen absorbing layer 20c, and the charge storage layer 20b. A thickness of the interface insulating layer 20a is, for example, about 1 nanometer (nm) or more and about 5 nm or less.

The charge storage layer 20b is also provided between the semiconductor layer 10 and the interlayer insulating layers 12. The charge storage layer 20b is a layer continuous in the z direction.

The charge storage layer 20b includes at least one oxide selected from aluminum oxide, yttrium oxide, lanthanum oxide, gadolinium oxide, ytterbium oxide, hafnium oxide, and zirconium oxide.

The oxide included in the charge storage layer 20b includes, for example, a hole-modulated conductive oxide whose specific resistance varies with the amount of oxygen vacancies.

The oxide included in the charge storage layer 20b includes, for example, an electride. The oxide includes, for example, an electride including calcium oxide and aluminum oxide. The oxide includes, for example, an electride having a chemical composition of $12CaO \cdot 7Al_2O_3$.

The charge storage layer 20b has a function of emitting oxygen ions according to an applied electric field and generating and accumulating oxygen vacancies having positive charges. For example, the charge storage layer 20b is capable of accumulating oxygen vacancies of about $5 \times 10^{19}$ $cm^{-3}$ or more and about $1 \times 10^{21}$ $cm^{-3}$ or less.

A thickness of the charge storage layer 20b is, for example, about 1 nm or more and about 10 nm or less.

The oxygen absorbing layer 20c is provided between the interface insulating layer 20a and the charge storage layer 20b. The oxygen absorbing layer 20c is also provided between the semiconductor layer 10 and the interlayer insulating layers 12. The oxygen absorbing layer 20c is a layer continuous in the z direction.

The oxygen absorbing layer 20c includes at least one semiconductor selected from silicon, germanium, silicon germanium, and silicon carbide. The oxygen absorbing layer 20c is, for example, amorphous.

The amorphous characteristics of the oxygen absorbing layer 20c can be determined, for example, based on whether or not a presence of a clear crystal grain is confirmed by observation with the TEM of the oxygen absorbing layer 20c.

The oxygen absorbing layer 20c has a function of absorbing and retaining oxygen ions released from the charge storage layer 20b as interstitial oxygen. The oxygen absorbing layer 20c has a function of making the absorbed oxygen ions electrically neutral. A thickness of the oxygen absorbing layer 20c is, for example, about 1 nm or more and about 5 nm or less.

Figure 4:
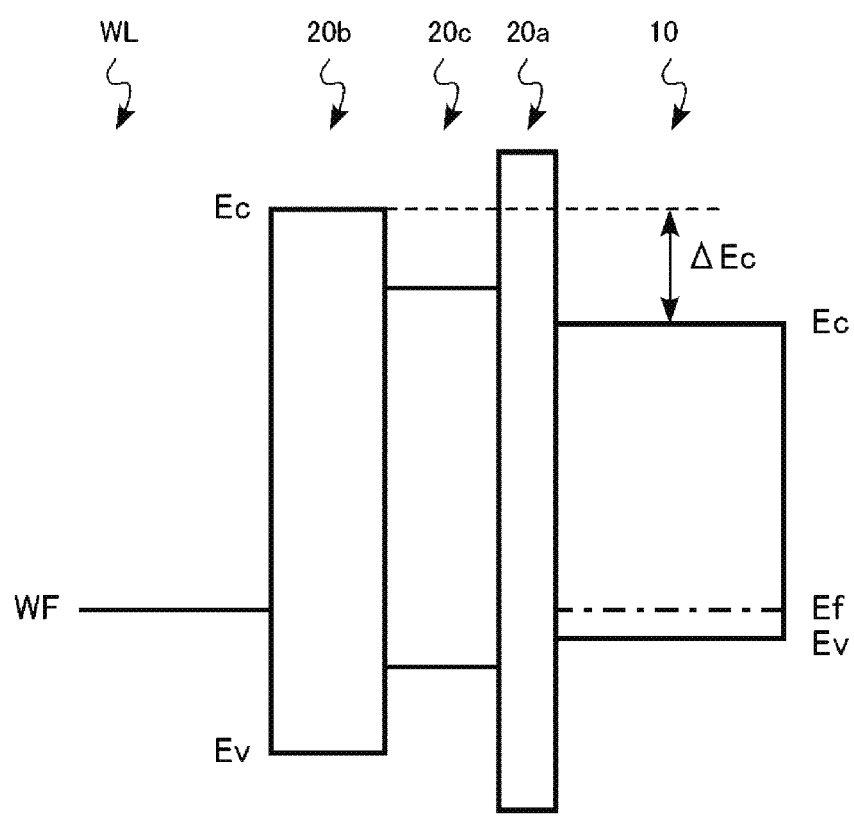
FIG. 4 is an energy band diagram of the semiconductor memory device according to the first embodiment.

FIG. 4 is an example energy band diagram of the semiconductor memory device according to the first embodiment. FIG. 4 illustrates energy states of the word line WL, the charge storage layer 20b, the oxygen absorbing layer 20c, the interface insulating layer 20a, and the semiconductor layer 10.

FIG. 4 illustrates an example in which a work function of the word line WL (WF in FIG. 4) and a Fermi level of the semiconductor layer 10 (Ef in FIG. 4) approximately coincide. FIG. 4 illustrates a state in which a voltage is not applied between the semiconductor layer 10 and the word line.

A difference (ΔEc in FIG. 4) between an electron affinity of the semiconductor layer 10 and an electron affinity of the charge storage layer 20b is, for example, about 0.8 eV or more.

The memory cell transistor MT includes the word line WL, the gate insulating layer 20, and the semiconductor layer 10. The memory cell MC has a function of holding data based on a level of a charge amount accumulated in the charge storage layer 20b of the memory cell transistor MT.

The data held in the memory cell MC is a threshold voltage of the memory cell transistor MT according to the level of the charge amount accumulated in the charge storage layer 20b. For example, data of two or more values may be stored in the memory cell MC using different threshold voltages.

One end of the semiconductor layer 10 is electrically connected to the common source line CSL (an example of a first conductive layer). For example, a ground potential is applied to the common source line CSL. The common source line CSL includes, for example, an n-type impurity region provided in the semiconductor substrate.

The other end of the semiconductor layer 10 is electrically connected to the bit line BL (an example of a second conductive layer). The bit line BL has a function of transferring data read from the memory cell MC. In addition, the bit line BL has a function of transferring data to be written to the memory cell MC. The bit line BL includes, for example, a metal.

The source select transistor SST has a function of selecting the memory string MS based on a signal applied to the source select gate line SGS. The drain select transistor SDT has a function of selecting the memory string MS based on a signal applied to the drain select gate line SGD.

The first peripheral circuit 101 is connected to the plurality of word lines WL. The first peripheral circuit 101 has a function of selecting a desired word line WL. The first peripheral circuit 101 has a function of applying a commanded voltage to the selected word line WL.

The second peripheral circuit 102 is connected to the plurality of bit lines BL. The second peripheral circuit 102 has a function of selecting a desired bit line BL. In addition, the second peripheral circuit 102 has a function of sensing the data of the memory cell MC read from the selected bit line BL. In addition, the second peripheral circuit 102 has a function of transferring the data to be written to the memory cell MC to the selected bit line BL. The second peripheral circuit 102 includes, for example, a sense amplifier circuit.

The control circuit 110 controls an operation of the first peripheral circuit 101 and an operation of the second peripheral circuit 102. The control circuit 110 has a function of causing the first peripheral circuit 101 and the second peripheral circuit 102 to execute a write sequence, a read sequence, and an erase sequence for the memory cell MC.

Hereinafter, an operation and an effect of the semiconductor memory device according to the first embodiment will be described.

Figure 5A:
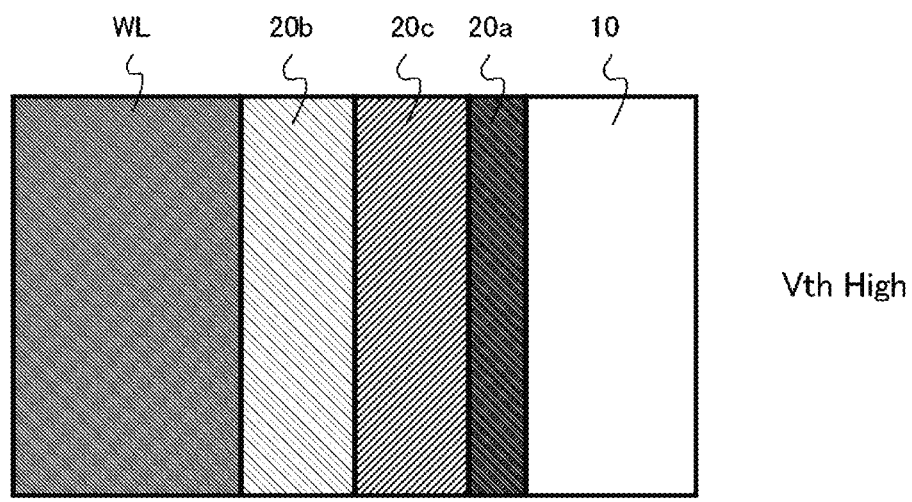
FIGS. 5A and 5B are explanatory diagrams for an operation of the memory cell of the semiconductor memory device according to the first embodiment.
Figure 5B:
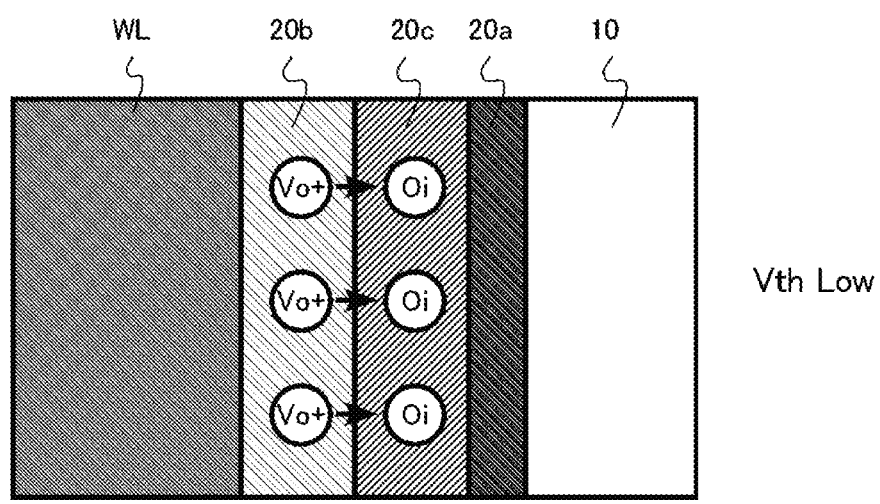

FIGS. 5A and 5B are explanatory diagrams for the operation of the memory cell of the semiconductor memory device according to the first embodiment.

FIG. 5A illustrates a state in which a charge is not accumulated in the charge storage layer 20b. In this case, the threshold voltage (Vth) of the memory cell transistor MT is relatively high.

FIG. 5B illustrates a state in which the charge is accumulated in the charge storage layer 20b. A positive charge is accumulated in the charge storage layer 20b due, at least in part, to the presence of the oxygen vacancy (Vo+ in FIG. 5B) having the positive charge in the charge storage layer 20b. It should be noted that, in FIGS. 5A and 5B, the oxygen vacancy is described as Vo+, but a valence of the oxygen vacancy is not limited to monovalent.

For example, from the state illustrated in FIG. 5A, a relatively low voltage is applied to the word line WL with respect to the semiconductor layer 10. Then, the oxygen ion is released from the charge storage layer 20b and moved to the oxygen absorbing layer 20c. The oxygen ion is absorbed by the oxygen absorbing layer 20c and becomes interstitial oxygen (Oi in FIG. 5B). The interstitial oxygen Oi becomes electrically neutral in the oxygen absorbing layer 20c.

A total charge accumulated in the gate insulating layer 20 becomes a positive charge and the threshold voltage (Vth) of the memory cell transistor MT becomes relatively lower than the state of FIG. 5A.

As described above, the memory cell transistor MT may have two threshold voltages of high and low levels. Therefore, the memory cell MC may store binary information, that is, information for one bit.

For example, it is possible to provide a thin gate insulating layer of the memory cell of the MONOS type, and to provide a tunnel insulating film and a block insulating film having a minimum thickness of about 6 nm or more in order to prevent or mitigate stress induced leakage current (SILC), using the stacked structure of the interface insulating layer 20a, the oxygen absorbing layer 20c, and the charge storage layer 20b in the gate insulating layer 20. Therefore, it is possible to reduce the size of the memory cell. Thus, it is possible to achieve a large capacity flash memory.

The difference ($\Delta Ec$ in FIG. 4) between the electron affinity of the semiconductor layer 10 and the electron affinity of the charge storage layer 20b is, for example, about 0.8 eV or more, or about 1.0 eV or more.

A tunnel current flowing through the interface insulating layer 20a can be reduced between the semiconductor layer 10 and the charge storage layer 20b by setting the difference $\Delta Ec$ in the electron affinities to have the above-described specifications. In addition, supplying of electrons from the word line WL beyond a barrier of the charge storage layer 20b to the charge storage layer 20b is prevented or mitigated. Therefore, a charge retention characteristic of the charge storage layer 20b is improved, and it is possible to increase a variation width of the threshold voltage. In addition, reliability of the memory cell MC is improved.

For example, when the semiconductor layer 10 includes silicon or when the charge storage layer 20b includes aluminum oxide, yttrium oxide, lanthanum oxide, gadolinium oxide, ytterbium oxide, hafnium oxide, or zirconium oxide, the difference $\Delta Ec$ in electron affinities is about 0.8 eV or more. In addition, when the semiconductor layer 10 includes silicon or when the charge storage layer 20b includes aluminum oxide, yttrium oxide, lanthanum oxide, gadolinium oxide, ytterbium oxide, or hafnium oxide, the difference $\Delta Ec$ in electron affinities is about 1.0 eV or more.

It should be noted that the interlayer insulating layers 12 need not be provided between the adjacent word lines WL, and a portion between the adjacent word lines WL may be formed as a gap.

In addition, a case where the charge storage layer 20b accumulates the oxygen vacancies having positive charges has been described as an example. However, for example, the charge accumulation layer 20b may accumulate oxygen ions having negative charges as interstitial oxygen in some cases. In this case, the oxygen ions are supplied from, for example, an oxide film including a suboxide formed at an interface between the oxygen absorbing layer 20c and the charge storage layer 20b.

As described above, according to the semiconductor memory device according to the first embodiment, it is possible to provide a thin gate insulating layer of the memory cell. Therefore, it is possible to increase the capacity of the semiconductor memory device.

Second Embodiment

The semiconductor memory device according to the second embodiment is different from the first embodiment at least in that the second layer is segmented between the semiconductor layer and the insulating layer. Hereinafter, description of certain features of the second embodiment similar to certain already-described features of the first embodiment may be omitted.

The semiconductor memory device according to the second embodiment is a three-dimensional NAND flash memory where a plurality of memory cells are three-dimensionally arranged.

Figure 6:
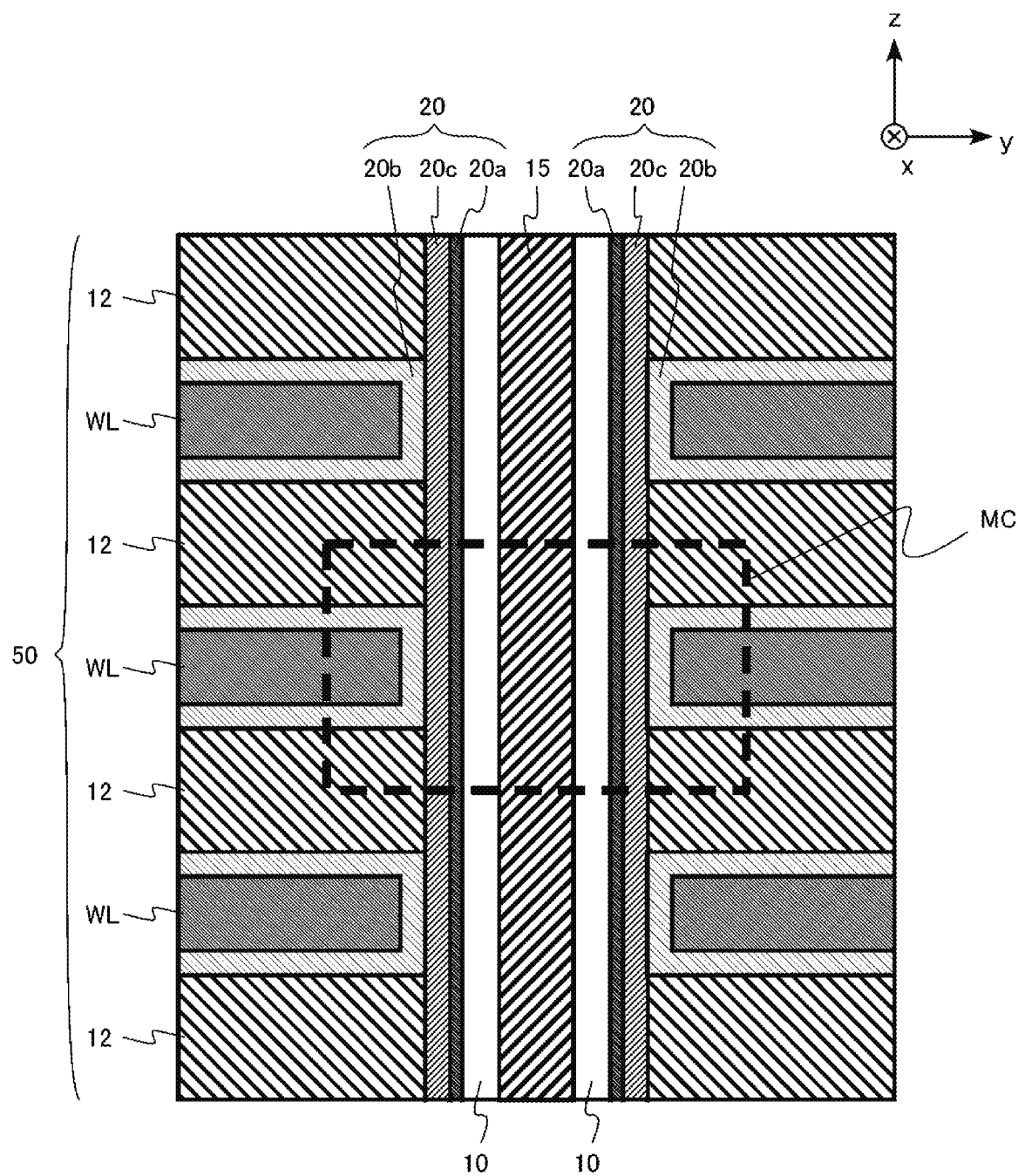
FIG. 6 is a schematic cross-sectional view of a memory string of a semiconductor memory device according to a second embodiment of the present disclosure.

FIG. 6 is a schematic cross-sectional view of a memory string of the semiconductor memory device according to the second embodiment. In FIG. 6, a region surrounded by a dotted line corresponds to one memory cell MC and includes one memory cell transistor MT.

As illustrated in FIG. 6, the memory cell array includes the plurality of word lines WL (an example of gate electrode layers), the semiconductor layer 10, the plurality of interlayer insulating layers 12 (an example of insulating layers), the core insulating layer 15, and the gate insulating layer 20. The plurality of word lines WL and the plurality of interlayer insulating layers 12 form the stacked body 50. The gate insulating layer 20 includes the interface insulating layer 20a (an example of a first layer), the charge storage layer 20b (an example of a second layer), and the oxygen absorbing layer 20c (an example of a third layer).

The charge storage layer 20b is segmented. The segments of the charge storage layer 20b are not disposed between the semiconductor layer 10 and the interlayer insulating layers 12. The segments of the charge storage layer 20b are disposed between the semiconductor layer 10 and the word lines WL. The segments of the charge storage layer 20b may respectively surround at least portions of the word lines WL. The charge storage layer 20b is not continuous in the z direction. The charge storage layer 20b is segmented between adjacent memory cells MC.

Since the charge storage layer 20b is segmented between the adjacent memory cells MC, a charge due to an accumulated lattice defect is prevented from moving to the adjacent cell, and a data retention characteristic is improved. In addition, since an influence of the charge accumulated in the charge storage layer 20b between the semiconductor layer 10 and the interlayer insulating layers 12 on the data of the memory cell MC is eliminated or reduced, erroneous writing to the memory cell MC adjacent to the selected memory cell MC and erroneous reading to the memory cell MC adjacent to the selected memory cell MC are prevented. Therefore, the reliability of the three-dimensional NAND flash memory is improved.

As described above, according to the semiconductor memory device according to the second embodiment, it is possible to increase the capacity of the semiconductor memory device similarly to the first embodiment. Further, the reliability of the semiconductor memory device is improved.

Third Embodiment

The semiconductor memory device according to the third embodiment is different from the first embodiment at least in that the gate insulating layer is provided between the second layer and the third layer, and includes a fourth layer provided with the second insulator. Hereinafter, description of certain features of the third embodiment similar to certain already-described features of the first embodiment may be omitted.

The semiconductor memory device of the third embodiment is a three-dimensional NAND flash memory where a plurality of memory cells are three-dimensionally arranged.

Figure 7:
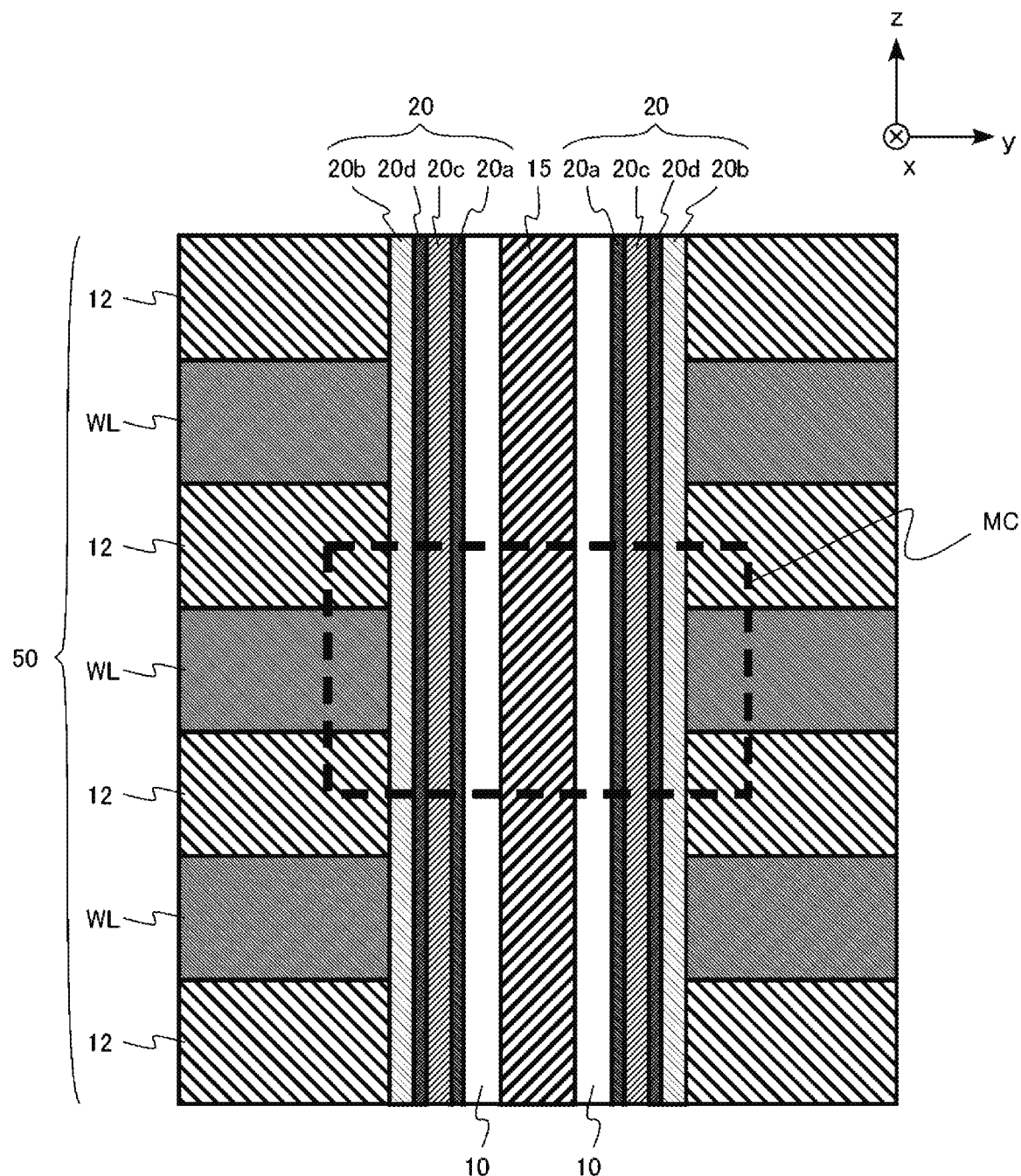
FIG. 7 is a schematic cross-sectional view of a memory string of a semiconductor memory device according to a third embodiment.

FIG. 7 is a schematic cross-sectional view of a memory string of the semiconductor memory device of the third embodiment. In FIG. 7, a region surrounded by a dotted line corresponds to one memory cell MC and includes one memory cell transistor MT.

As illustrated in FIG. 7, the memory cell array includes the plurality of word lines WL (an example of gate electrode layers), the semiconductor layer 10, the plurality of interlayer insulating layers 12 (an example of insulating layers), the core insulating layer 15, and the gate insulating layer 20. The plurality of word lines WL and the plurality of interlayer insulating layers 12 form the stacked body 50. The gate insulating layer 20 includes the interface insulating layer 20a (an example of a first layer), the charge storage layer 20b (an example of a second layer), the oxygen absorbing layer 20c (an example of a third layer), and an intermediate insulating layer 20d (an example of a fourth layer).

The intermediate insulating layer 20d is provided between the charge storage layer 20b and the oxygen absorbing layer 20c. The intermediate insulating layer 20d is also provided between the semiconductor layer 10 and the interlayer insulating layers 12. The intermediate insulating layer 20d is a layer continuous in the z direction.

The intermediate insulating layer 20d includes a second insulator. The second insulator includes, for example, an oxide, a nitride, or an oxynitride. The second insulator includes, for example, aluminum oxide.

The intermediate insulating layer 20d has a function of preventing a movement of an element between the charge storage layer 20b and the oxygen absorbing layer 20c. The intermediate insulating layer 20d prevents, for example, the element configuring the charge storage layer 20b from moving to the oxygen absorbing layer 20c. The intermediate insulating layer 20d prevents, for example, the element configuring the oxygen absorbing layer 20c from moving to the charge storage layer 20b.

A thickness of the intermediate insulating layer 20d is, for example, about 0.5 nm or more and about 5 nm or less.

Since the intermediate insulating layer 20d prevents the movement of the element between the charge storage layer 20b and the oxygen absorbing layer 20c, degradation of a charge retention characteristic of the memory cell MC is prevented. Therefore, the reliability of the three-dimensional NAND flash memory is improved.

As described above, according to the semiconductor memory device of the third embodiment, it is possible to increase the capacity of the semiconductor memory device similarly to the first embodiment. Further, the reliability of the semiconductor memory device is improved.

Fourth Embodiment

The semiconductor memory device of the fourth embodiment is different from the first embodiment at least in that a positioning of the layers configuring the gate insulating layer is different. Hereinafter, description of certain features of the fourth embodiment similar to certain already-described features of the first embodiment may be omitted.

The semiconductor memory device of the fourth embodiment is a three-dimensional NAND flash memory where a plurality of memory cells are three-dimensionally arranged.

Figure 8:
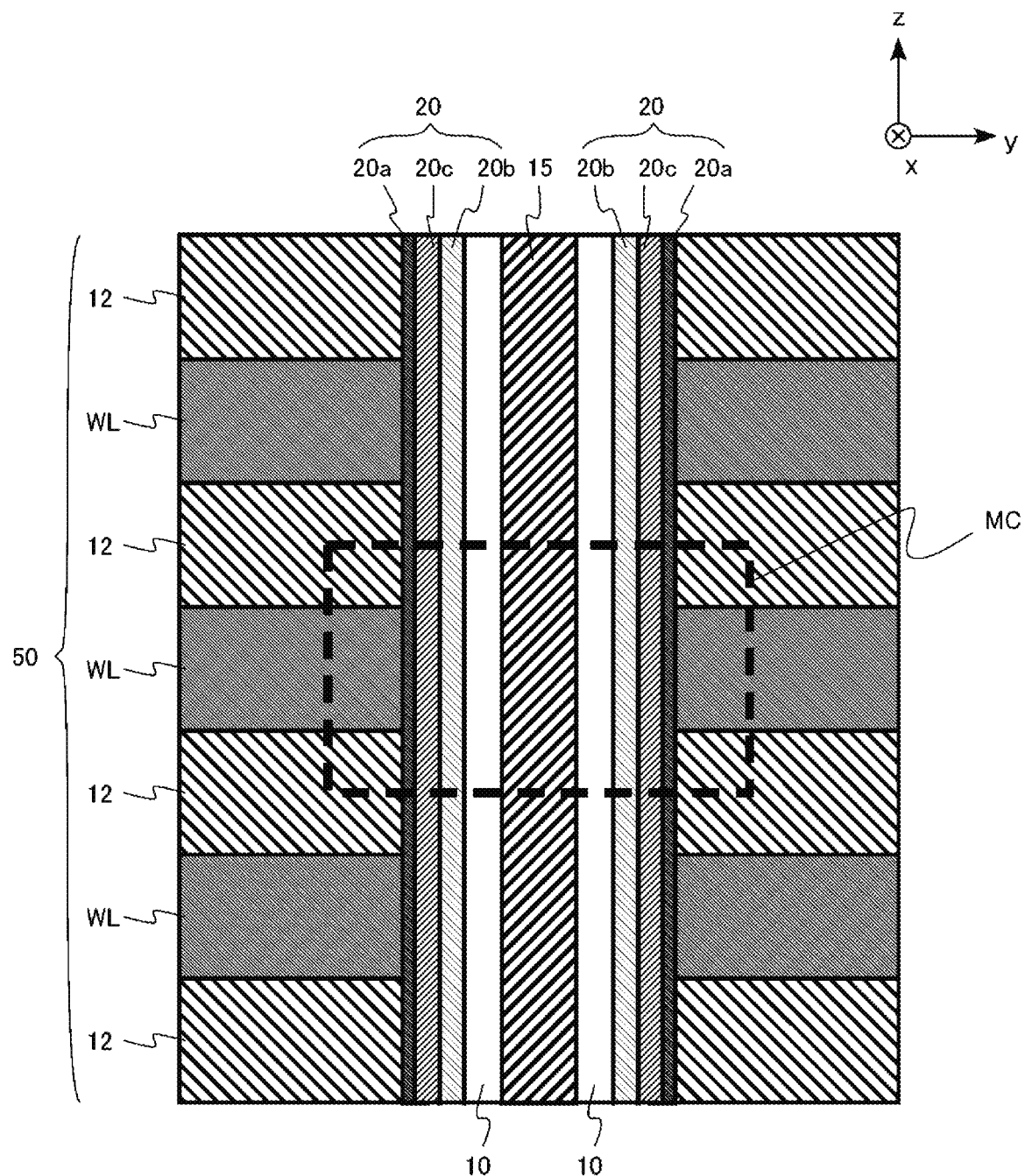
FIG. 8 is a schematic cross-sectional view of a memory string of a semiconductor memory device according to a fourth embodiment.

FIG. 8 is a schematic cross-sectional view of a memory string of the semiconductor memory device of the fourth embodiment. In FIG. 8, a region surrounded by a dotted line corresponds to one memory cell MC and includes one memory cell transistor MT.

As illustrated in FIG. 8, the memory cell array includes the plurality of word lines WL (an example of gate electrode layers), the semiconductor layer 10, the plurality of interlayer insulating layers 12 (an example of insulating layers), the core insulating layer 15, and the gate insulating layer 20. The plurality of word lines WL and the plurality of interlayer insulating layers 12 form the stacked body 50. The gate insulating layer 20 includes the interface insulating layer 20a (an example of a first layer), the charge storage layer 20b (an example of a second layer), and the oxygen absorbing layer 20c (an example of a third layer).

The gate insulating layer 20 is provided between the semiconductor layer 10 and the word lines WL. The gate insulating layer 20 includes the interface insulating layer 20a, the charge storage layer 20b, and the oxygen absorbing layer 20c. The charge storage layer 20b, the oxygen absorbing layer 20c, and the interface insulating layer 20a are provided in that order from the semiconductor layer 10 toward the word lines WL.

As described above, according to the semiconductor memory device of the fourth embodiment, it is possible to increase the capacity of the semiconductor memory device similarly to the first embodiment.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device comprising:
    a stacked body comprising insulating layers and gate electrode layers that are alternately stacked in a direction;
    a semiconductor layer extending in the direction; and
    a gate insulating layer provided between the semiconductor layer and the gate electrode layers, and including a first layer, a second layer, and a third layer between the first layer and the second layer, wherein
    the first layer includes a first insulator, the second layer includes at least one oxide selected from aluminum oxide, yttrium oxide, lanthanum oxide, gadolinium oxide, ytterbium oxide, hafnium oxide, and zirconium oxide, the third layer includes at least one material selected from silicon, germanium, silicon germanium and silicon carbide, and the third layer is positioned between the semiconductor layer and the insulating layers.

2. The semiconductor memory device according to claim 1, wherein
    the second layer is segmented and is not disposed between the semiconductor layer and the insulating layers.

3. The semiconductor memory device according to claim 1, wherein the gate insulating layer includes a fourth layer provided between the second layer and the third layer and including a second insulator.

4. The semiconductor memory device according to claim 3, wherein
the second insulator includes aluminum oxide.

5. The semiconductor memory device according to claim 1, wherein
the first insulator includes silicon oxide or aluminum oxide.

6. The semiconductor memory device according to claim 1, wherein
the at least one oxide includes an electride.

7. The semiconductor memory device according to claim 1, further comprising:
a first conductive layer electrically connected to a first end of the semiconductor layer and a second conductive layer electrically connected to a second end of the semiconductor layer.

8. The semiconductor memory device according to claim 1, wherein
the third layer is amorphous.

9. A semiconductor memory device comprising:
a stacked body in which insulating layers and gate electrode layers are alternately stacked in a direction;
a semiconductor layer extending in the direction; and
a gate insulating layer provided between the semiconductor layer and the gate electrode layers, and including a first layer, a second layer, and a third layer between the first layer and the second layer, wherein
the first layer includes a first insulator, the second layer includes at least one oxide selected from aluminum oxide, yttrium oxide, lanthanum oxide, gadolinium oxide, ytterbium oxide, hafnium oxide, and zirconium oxide, and the third layer includes at least one material selected from silicon, germanium, silicon germanium, and silicon carbide.

10. The semiconductor memory device according to claim 9, wherein
the second layer is segmented and is not disposed between the semiconductor layer and the insulating layer.

11. The semiconductor memory device according to claim 9, wherein
the gate insulating layer includes a fourth layer provided between the second layer and the third layer and the fourth layer includes a second insulator.

12. The semiconductor memory device according to claim 9, wherein
the second insulator includes aluminum oxide.

13. The semiconductor memory device according to claim 9, wherein
the first insulator includes silicon oxide or aluminum oxide.

14. The semiconductor memory device according to claim 9, wherein
the at least one oxide includes an electride.

15. The semiconductor memory device according to claim 9, further comprising:
a first conductive layer electrically connected to a first end of the semiconductor layer and a second conductive layer electrically connected to a second end of the semiconductor layer.

16. A semiconductor memory device comprising:
a plurality of gate electrode layers stacked in a direction and spaced apart from each other;
a semiconductor layer extending in the direction; and
a gate insulating layer provided between the semiconductor layer and the plurality of gate electrode layers, and including a first layer, a second layer, and a third layer between the first layer and the second layer, wherein
the first layer includes a first insulator, the second layer includes at least one oxide selected from aluminum oxide, yttrium oxide, lanthanum oxide, gadolinium oxide, ytterbium oxide, hafnium oxide, and zirconium oxide, the third layer includes at least one material selected from silicon, germanium, silicon germanium, and silicon carbide, and the third layer is positioned between the plurality of gate electrode layers and the semiconductor layer.

17. The semiconductor memory device according to claim 16, wherein a thickness of the first layer is about 1 nanometer (nm) or more and about 5 nm or less.

18. The semiconductor memory device according to claim 16, wherein a thickness of the second layer is about 1 nm or more and about 10 nm or less.

19. The semiconductor memory device according to claim 16, wherein a thickness of the third layer is about 1 nm or more and about 5 nm or less.

20. The semiconductor memory device according to claim 16, wherein a thickness of the first layer is about 1 nm or more and about 5 nm or less, a thickness of the second layer is about 1 nm or more and about 10 nm or less, and a thickness of the third layer is about 1 nm or more and about 5 nm or less.

* * * * *